(12) United States Patent
Lee et al.

(10) Patent No.: US 6,747,857 B1
(45) Date of Patent: Jun. 8, 2004

(54) CLAMPING CIRCUIT FOR STACKED NMOS ESD PROTECTION

(75) Inventors: Jian-Hsing Lee, Hsin-Chu (TW); Hung-Der Su, Kao-Hsiung (TW); Jiaw-Ren Shih, Hsin-chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 105 days.

(21) Appl. No.: 10/062,706

(22) Filed: Feb. 1, 2002

(51) Int. Cl.[7] ............................................... H02H 9/00
(52) U.S. Cl. ............................................ 361/56; 361/56
(58) Field of Search ........................ 361/56, 91.1, 91.2, 361/91.5, 91.6, 111, 118, 91

(56) References Cited

U.S. PATENT DOCUMENTS

| | | | | |
|---|---|---|---|---|
| 5,173,755 A | * | 12/1992 | Co et al. ............... 257/361 |
| 5,444,591 A | * | 8/1995 | Chokhawala et al. ......... 361/18 |
| 5,610,790 A | | 3/1997 | Staab et al. .............. 361/56 |
| 5,708,550 A | | 1/1998 | Avery ................... 361/56 |
| 5,930,094 A | * | 7/1999 | Amerasekera et al. ........ 361/56 |
| 5,986,867 A | | 11/1999 | Duvvury et al. ........... 361/111 |
| 6,008,970 A | | 12/1999 | Maloney et al. ............ 361/56 |
| 6,008,974 A | | 12/1999 | Lee et al. ............... 361/111 |
| 6,078,487 A | | 6/2000 | Partovi et al. ............ 361/56 |
| 6,091,594 A | | 7/2000 | Williamson et al. ......... 361/111 |
| 6,091,595 A | | 7/2000 | Sharpe-Geisler ............ 361/111 |
| 6,125,021 A | * | 9/2000 | Duvvury et al. ............ 361/56 |
| 6,342,803 B1 | * | 1/2002 | McManus ................. 327/318 |
| 6,369,427 B1 | * | 4/2002 | Williamson .............. 257/355 |
| 6,444,511 B1 | * | 9/2002 | Wu et al. ................ 438/199 |
| 6,469,560 B1 | * | 10/2002 | Chang et al. .............. 327/310 |
| 2002/0154463 A1 | * | 10/2002 | Mergens et al. ............ 361/56 |

* cited by examiner

Primary Examiner—Brian Sircus
Assistant Examiner—Danny Nguyen
(74) Attorney, Agent, or Firm—George O. Saile; Stephen B. Ackerman

(57) ABSTRACT

A novel device and process is described for an ESD protection device for complimentary cascaded NMOS output circuit strings. The invention consists of a clamping NMOS with gate connected to the input or output pad through a diode and connected to ground through a resistor. The clamping device drain is connected to the signal gate of the active output NMOS and the clamping device source is connected to ground. An ESD event causes the diode to go into breakdown mode and the conduction current across the resistor places a positive voltage on the clamping device gate turning the clamping device on. This clamps the active NMOS signal gate to ground assuring that the output NMOS remains in an off condition during the ESD event. This prevents any damage due to high current flow through the active, or used output inverter string.

26 Claims, 5 Drawing Sheets

Clamped Circuit

FIG. 1 - Prior Art

CLAMPING CIRCUIT FOR STACKED NMOS ESD PROTECTION

BACKGROUND OF THE INVENTION (1) Field of the Invention

The present invention relates generally to a structure of and manufacturing process for a semiconductor device which provides improved ESD protection of active semiconductor devices and more particularly to a signal gate ground clamping element for cascaded metal oxide semiconductor (MOS) circuit configuration.

(2) Description of Prior Art

Because of high input impedance and thin oxide gate structures, the problem of Electrostatic Discharge (ESD) damage with field effect transistor (FET) devices can be severe. Therefore the input/output (I/O) circuit locations or pads usually have a protective device connected between the I/O pad and the internal circuits which allows the ESD current to be shunted to ground Another important characteristic of the ESD protection device is that it must not interfere with the operation of the devices it is designed to protect, while at the same time providing good protection when abnormal or ESD voltage incidents occur.

Typical ESD protection devices consist of a N channel metal oxide semiconductor (NMOS) connected to I/O pad A parasitic NPN bipolar device is essentially in parallel with the NMOS device which has a collector base breakdown triggered by the ESD voltage. Once triggered by an ESD incident, the parasitic device operates in a secondary breakdown mode to clamp the ESD voltage to a suitable level and pass the high current to a second voltage source, typically ground.

Integrated logic circuits frequently have a complimentary MOS output string as typified in FIG. 1 utilizing "used" or active devices PMOS PU1, first or cascaded NMOS NU1, second or switched NMOS NU2, and "unused" or "dummy" I/O strings represented by devices PMOS PD1, first unused NMOS ND1, and second unused NMOS ND2. In addition to the complimentary PMOS PU1 and NMOS NU2 signal driven switching devices in the active I/O, the "used" logic string shown in FIG. 1 also has a cascaded first NMOS NU1 in series with the switched second active or "used" NMOS NU2. The gate of first NMOS NU1 has its gate tied to Vcc. This cascaded FET NU1 provides flexibility in circuit logic voltage levels while utilizing a specific FET device design.

In addition to the "used" or active I/O string, a "Dummy I/O" or inactive device string is shown in FIG. 1. The string is comprised of a PMVOS PD1 with its gate and drain tied too Vcc, and its source tied to the output pad 1 and to the drain of the cascaded firs "unused or dummy NMOS ND1. The source of the cascaded NMOS ND1 is tied to the lower second "mused" NMOS ND2. The gate and source of NMOS ND2 are tied to ground.

Referring to the "used" device string, a high logic level signal from the internal circuit, typically 3.3 V or 5V, will turn on the second NMOS NU2 in the "used" or active string essentially pulling the output pad 1 voltage down to ground. The same logic signal assures that the PMOS PU1 is turned off preventing any current flow in the string except during the switching transition. Conversely, a low logic signal from die internal circuit will turn on PMOS PU1 and turn off the NMOS NU2 presenting a voltage at or near Vcc at the output pad.

If an ESD event occurs while the second "used" NMOS NU2 is turned on, high current can flow through the device with the potential for device damage. In addition, even with the device in the off state, a phenomenon known as hot carrier gate tunneling may turn the device on during an ESD event The hot carrier gate tunneling is caused by a high voltage such as produced by an ESD event, being placed on the drain of the NMOS NU2. Carriers gain sufficient energy to cause a positive charge or voltage to accumulate on the gate. This hot carrier gate tunneling positive gate voltage could turn the NMOS NU2 device on, again exposing the device to damage from high ESD current This gate action is detrimental to ESD protection, and damage can possibly occur to one or more devices in the string. A device and method is described which greatly enhances the ESD protection capability of the cascaded NMOS device circuitry and limits the possibility of ESD damage to these devices.

The following patents describe ESD protection devices.

U.S. Pat. No. 6,008,974 (Lee et al.) describes a CMOS ESD output protection circuit with a clamping circuit to prevent NMOS damage. The clawing circuit comprises an NMOS transistor, a resistor, and a diode.

U.S. Pat. No. 5,986,867 (Duvvury) discloses an output protection circuit where an NMOS transistor is used as a dummy device.

U.S. Pat. No. 6,091,594 (Williamson et al) shows a CMOS ESD protection circuit where a cascaded NMOS stack is used.

U.S. Pat. No. 6,078,487 (Partovi et al.) shows an ESD circuit with an ESD clamp.

U.S. Pat. No. 6,091,595 (Sharpe Geisler) shows an ESD protection circuit for a 5V output buffer.

U.S. Pat. No. 5,610,790 (Staab et al.), U.S. Pat. No. 6,008,970 (Maloney et al.), and U.S. Pat. No. 5,708,550 (Avery) show related ESD circuits.

SUMMARY OF THE INVENTION

Accordingly, it is the primary objective of the invention to provide a novel effective circuit structure, and a circuit development method, for protecting integrated circuits from damage caused by ESD events occurring during circuit operation.

In addition, it is an objective of this invention to provide this ESD protection while maintaining appropriate normal circuit operating parameters of the devices being protected.

It is yet another object of the invention to provide a process method for forming the ESD protection structure that is fully compatible with the manufacturing process of the devices being protected.

The above objectives are achieved in accordance with the embodiments of the invention that describes a process and novel structure for a clamping FET device for the active signal switched NMOS transistor of the complimentary output inverter of CMOS logic devices. A NMOS clamping device has the drain connected to the gate of the output circuit string active switching NMOS that is normally controlled by the signal from the internal circuits. Therefore, the drain of the clamping NMOS device is also connected to the internal circuit signal line. The gate of the clamping device is connected to the output pad through a P–N diode with the diode negative N side connected to the I/O pad. The NMOS device gate is also connected to a second voltage source, typically ground, through a resistor. The source of the NMOS clamping device is connected directly to ground.

A high voltage from an ESD event causes the diode to operate in reverse breakdown mode thereby conveying a positive voltage to the gate of the clamping device turning it on enabling the active switched NMOS gate to be clamped to ground. Clamping the active NMOS gate to ground prevents the output device from being turned on during the duration of the ESD event by either a logic signal from the internal circuit or the hot carrier effect from the high ESD voltage on the drain. The resistor from the clamping device gate to ground provides the clamping device turn on voltage from the ESD event. The resistor is also in series with the diode, and therefore limits the current generated by the ESD event to protect the diode from damage.

During normal circuit operation the gate of the clamping device is shielded from normal logic signals by the diode, and is essentially grounded through the resistor assuring that the clamping device is in an off state. This prevents any interference with the normal I/O and logic circuit operational characteristics.

DESCRIPTION OF THE PREFERRED EMBODIMENTS

Figure 1:
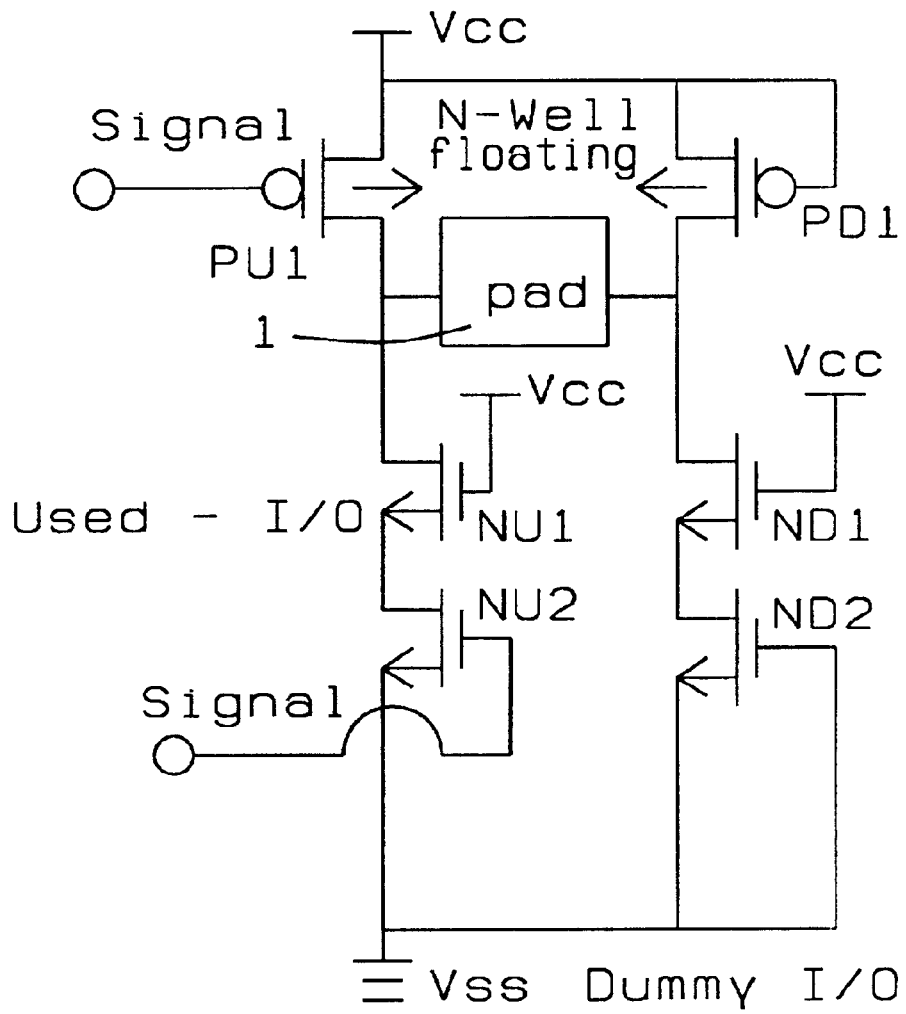
FIG. 1 is a schematic representation of a conventional prior art 5 volt I/O showing a "used" I/O string with cascaded NMOS devices and a "dummy" I/O string in parallel.
Figure 2:
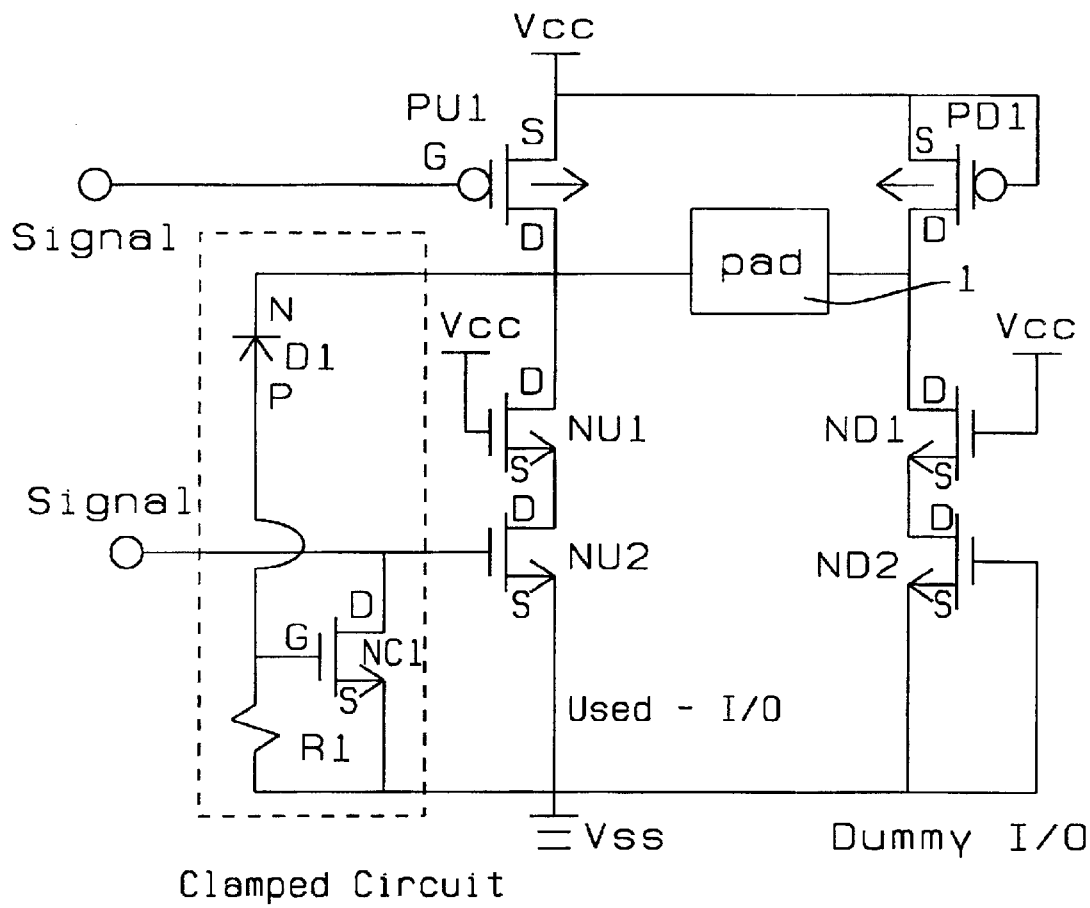
FIG. 2 is a schematic representation of the invention showing the "used" I/O string and the "dummy" I/O string, with the "used" string input signal gates connected to a NMOS ground clamp device and a simple diode connected from the clamp device gate to the I/O pad.
Figure 3:
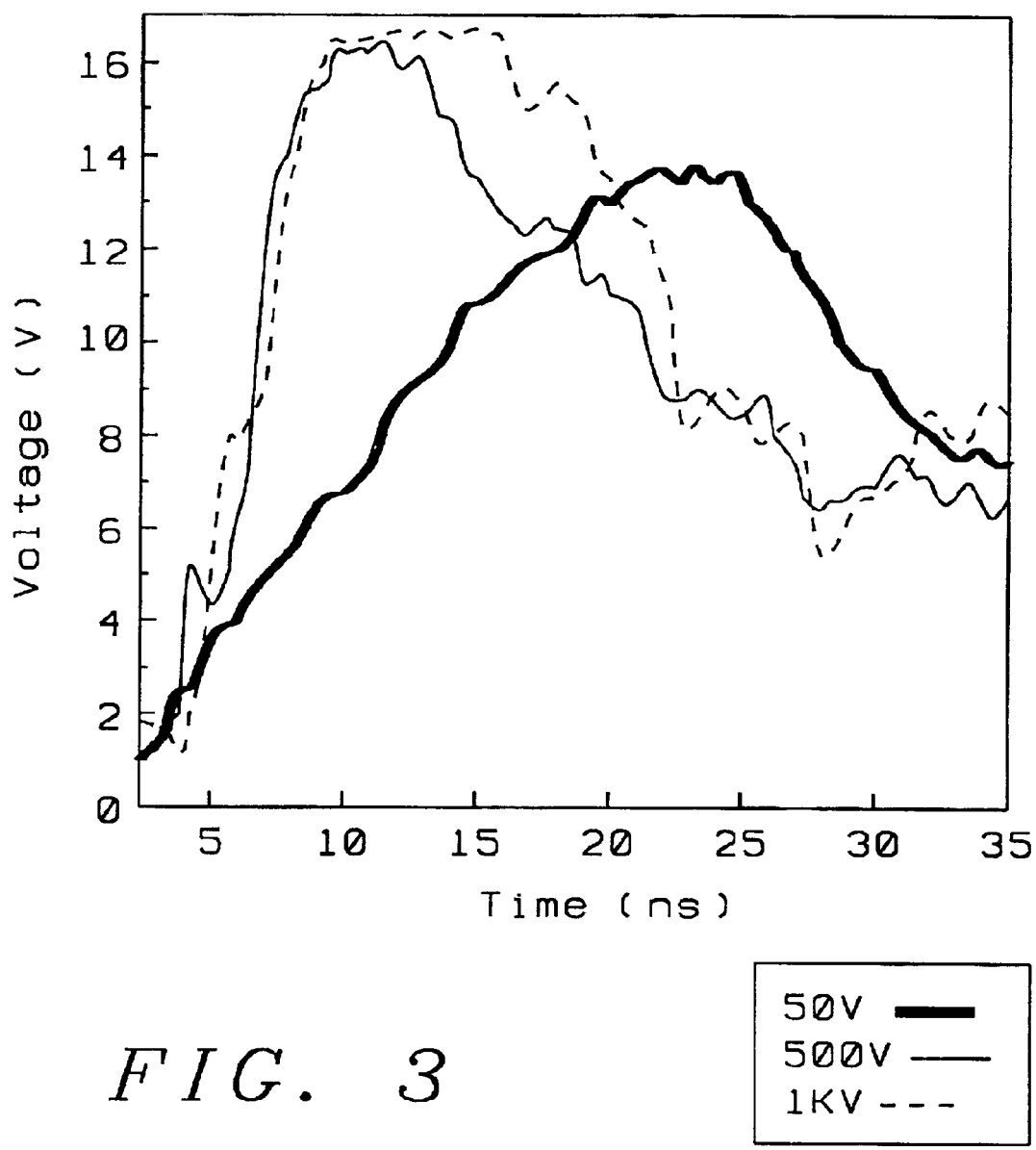
FIG. 3 is a representation of real time voltage waveforms for the invention for different test voltages generated by the Human Body Model (HBM).

FIG. 2 shows the invention as embodied by a cascaded complimentary CMOS circuit string The first string is the "used" or active string. It consists of a PMOS PU1 with the source connected to Vcc, a voltage typically between 2.5 and 5 volts, the gate connected to the internal logic signal line, and the drain connected to the I/O pad 1 and to the drain of the cascaded first "use" NMOS NU1. The cascaded NMOS NU1 has its gate tied to Vcc and the source connected to the drain of the second "used" NMOS NU2. The source of NMOS NU2 is connected to ground while the gate is connected to the same internal logic signal line as PMOS PU1. The number of active strings is not limited to only one series connected complimentary cascaded string The output current is a function of string current drive capability and the number of "used" or active strings in parallel connected to the same output pad It is estimated that each active output string can supply between 2 and 48 milliampers (ma) of output current.

In parallel with the "used" active string is an unused or dummy string consisting of a PMOS PD1 with gate and source connected to Vcc, and drain connected to the I/O pad 1, and the cascaded NMOS ND1 drain. The gate of cascaded NMOS ND1 is connected to Vcc and the source is connected to the drain of NMOS ND2. The gate and source of second NMOS ND2 are connected to ground.

A clamping NMOS device NC1 is a key feature of the embodiment of the invention. The clamping NMOS NC1 drain is connected to the gate of NMOS NU2 and the internal logic signal line. The gate of the clamping NMOS device NC1 is connected to the I/O pad 1 through a P–N diode D1 on one side, and to ground through resistor R1 on the other. The source of the clamping device NC1 is connected to ground.

During normal circuit operation, a high logic signal from the internal circuits will turn on the device NMOS NU2, essentially pulling down the voltage at the I/O pad 1 to ground, as the cascade device NMOS NU1 with the gate tied to Vcc is essentially always on.

Also, with the logic signal line high, "used" PMOS PU1 is turned off, assuring no current will flow except during the switching cycle.

Conversely, when the internal logic signal is low, NMOS device NU2 will be turned off and PMOS device PU1 will be turned on, providing a voltage at or near Vcc to be placed on the output pad 1. Again, current will only flow during the switching cycle.

An ESD event will place a high voltage at the output pad 1. This voltage will then be present on the drain of NMOS NU2 that in turn can result in hot carrier tunneling producing a positive voltage on the gate of NMOS NU2. This voltage can turn on the device for the duration of the ESD event, which exposes the device to potential damage. Another undesirable possibility is device NMOS NU2 could be in a conductive state when the ESD event is initiated during a high level signal from the internal circuits which could also result in potential damage of NMOS NU2.

A unique aspect of the invention is the action provided by the clamping device NC1, which, when activated, clamps the gate of used switching device NU2 to ground The diode has a typical breakdown voltage between about 8 to 12 volts. The ESD voltage is typically much higher than the diode D1 breakdown voltage as typified by the waveforms shown in FIG. 4 for various simulated ESD voltages. Therefore diode D1 will go into a reverse breakdown mode placing the ESD voltage minus the diode breakdown voltage across the resistor R1 and on the gate of the clamp device NC1. This turns on the NMOS NC1 clamping device clamping the gate of NMOS NU2 together with the active circuit signal line to ground This clamping action assures that NMOS NU2 is in the off condition during the ESD event even if the logic signal had been in a high state just prior to the event The ESD protection improvement is four to five times that of the conventional floating gate or resistor grounded gate configuration as indicated by Table 1. The resistor is typically in the range of 1 to 100 K ohms.

When the ESD voltage is removed, the output circuit will return to its normal operating state. During normal operation, the gate of the clamping device NC1 is essentially tied to ground through R1, and therefore in an off condition which prevents the device from interfering with normal circuit operation.

The improvements shown under ESD type testing are shown in Table 1. The ESD test voltage as represented by the Human Body Model (HBM) shows a nominal 4 times improvement while the ESD test voltage as represented by the Machine Model (MM) shows over a five times improvement for the clamped grounded gate invention circuit.

TABLE 1

Test Result for Conventional vs Clamped Gate Devices

| Device/Product Level | HBM | MM |
|---|---|---|
| Conventional 5VT I/O | 800 V | 50 V |
| Modified-Clamped Gate I/O | 3.5K V | 275 V |

Figure 4:
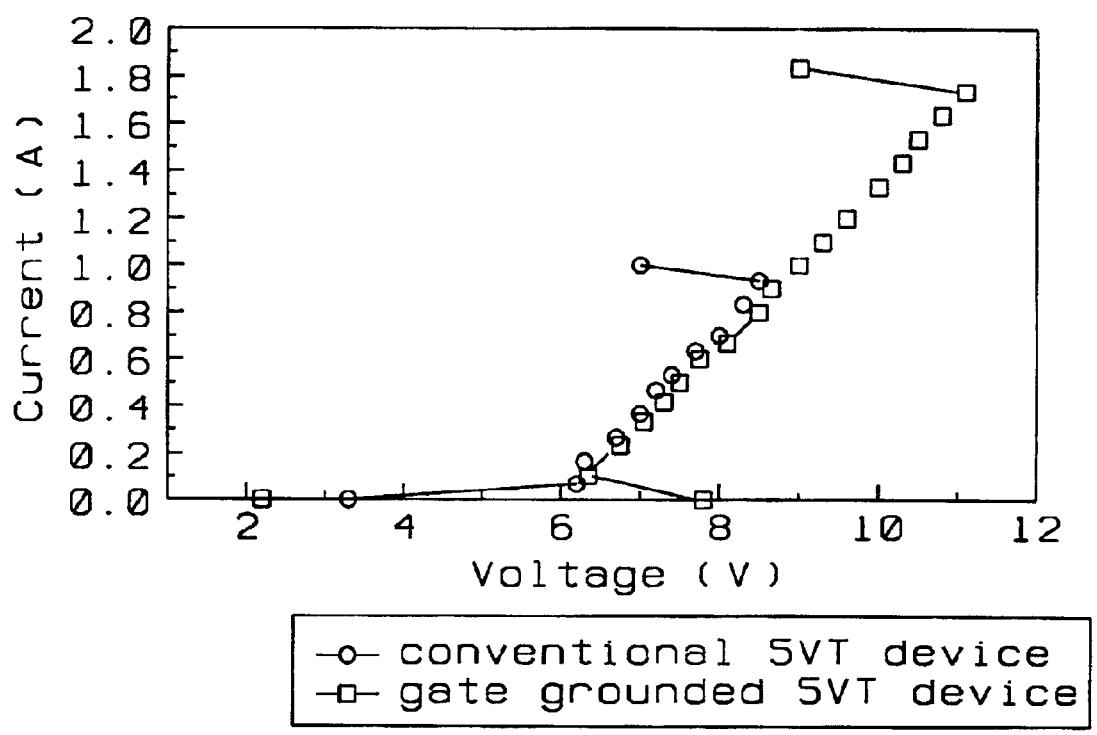
FIG. 4 Represents the snap-back characteristics of conventional "floating gate" cascaded NMOS output string vs. the grounded gate clamping circuit configuration of the invention showing improved performance for the invention configuration.

Also, as depicted in FIG. 4, the ESD device current is as high as 1.8 amps for a device with its gate clamped to ground, i.e., a grounded gate device, before entering into the secondary breakdown region. This is in contrast to the current capability of one amp or less for a conventional device before entering into the secondary breakdown region where device damage is likely to occur.

Figure 5:
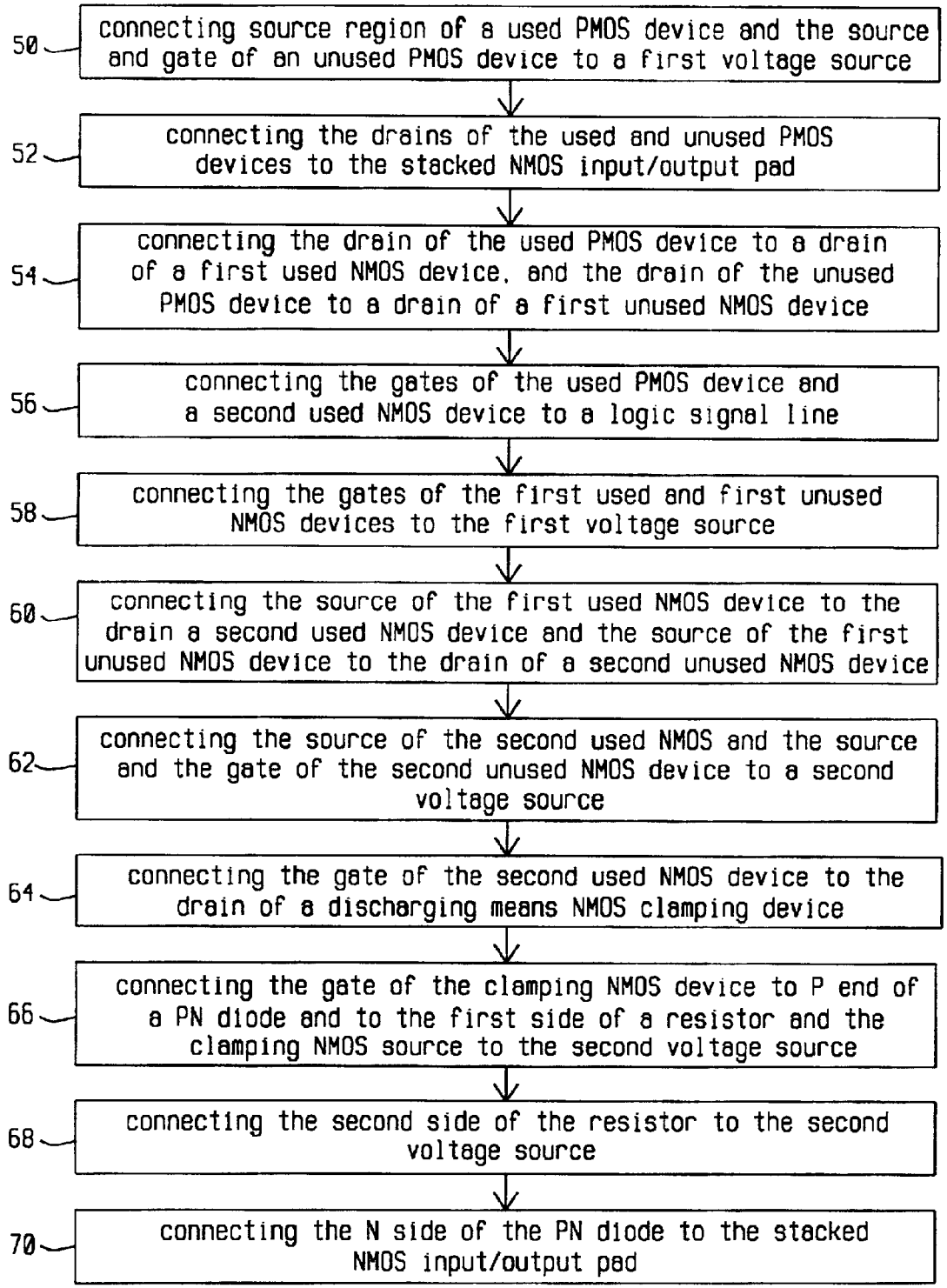
FIG. 5 is a flow diagram of the process of developing the grounded gate clamping circuit for stacked NMOS ESD protection.

The process for creating the clamping circuit for stacked NMOS ESD protection is illustrated in FIG. 5. As shown in element 50 of the flow diagram, connecting the source of the used PMOS device and the source and gate of the unused PMOS to the first voltage source, typically Vcc, can initiate the process The process is continued 52 by connecting the drains of the used and unused PMOS devices to the stacked NMOS input/output pad, and then 54 connecting the drain of the used PMOS device to the drain of a first used NMOS device, and connecting the dram of the unused PMOS device to the drain of a first unused NMOS device. Connecting the gate of the used PMOS device and the gate of the second used NMOS device to the internal circuit logic signal line is part of the process. Connecting the gates 58 of the first used and unused NMOS devices to the first voltage source and 60 connecting the source of the first used NMOS to the drain of the second used NMOS and connecting the source of the first unused NMOS device to the drain of the second unused NMOS device are additional process steps. FIG. 5-62 depicts connecting the source of the second used NMOS and the source and the gate of the second unused NMOS device to a second voltage source, typically ground.

The discharging means capability is provided as shown in FIG. 5-64 by connecting the gate of the second used NMOS device to the drain of the clamping NMOS device, connecting 66 the gate of the clamping device to the positive P side of the P–N diode and also connecting the gate to the first side of the resistor. Connecting the source of the NMOS clamping device to a second voltage source, typically ground continues the process as does connecting the second side of the resistor to the second voltage source 68.

The discharging means capability is provided as shown in FIG. 5-64 by connecting the gate of the second used NMOS device to the drain of the clamping NMOS device, connecting 66 the gate of the clamping device to the positive P side of the P–N diode and also connecting the gate to the first side of the resistor. Connecting the source of the NMOS clamping device to a second voltage source, typically ground and connecting the drain of the clamping NMOS device to the second terminal of the resistor and then to ground continues the process.

FIG. 5-70 represents connecting the negative N side of the P–N diode to the stacked NMOS input/output pad that enables the voltage trigger path for the clamping NMOS from an ESD event While the invention has been particularly shown and described with reference to the preferred embodiments thereof, it will be understood by those skilled in the art that various changes in form and details may be made without departing from the spirit and scope of the invention.

What is claimed is:

1. A protection circuit for protecting integrated semiconductor active devices from damage due to ESD voltages applied to an input or output signal pad said circuit comprising:

at least one switching circuit string composed of a first and second used NMOS device and a used PMOS device, wherein the gate of said first used NMOS device is connected to a first voltage source and the drain element of said first used NMOS device is connected to said input/output signal pad and to the drain element of said used PMOS device, and the source of said first used NMOS device is connected to the drain element of said second used NMOS device and the gates of said second used NMOS and said used PMOS are connected to an internal circuit and the source of said used second NMOS is connected to a second voltage source, and the source of said used PMOS is connected to said first voltage source; and a discharging means for discharging positive charges accumulated on said gate of said second used NMOS wherein said discharging means are connected to said internal circuit and said switching circuit string to prevent said second used NMOS from turning on from said ESD voltage.

2. The circuit according to claim 1 wherein said discharging means comprises a discharging NMOS device, a diode and a resistor.

3. The circuit according to claim 2 wherein the drain of said discharging NMOS device is connected to said internal circuit and to said gate of said second used NMOS, and the source of said discharging NMOS device is connected to said second voltage source and the gate of said discharging NMOS device is connected to said input/output signal pad through said diode and to said second voltage source through said resistor.

4. The circuit according to claim 2 wherein the positive terminal of said diode is connected to said discharging NMOS device gate and to a first side of said resistor and the negative terminal of said diode is connected to said input/output pad.

5. The circuit according to claim 2 wherein said resistor has a value between 1 and 100 K ohms.

6. The circuit according to claim 1 wherein said switching circuit string provides a driving current to said output pad.

7. The circuit according to claim 6 wherein a value of said driving current is determined by the total number of said switching strings and whereby each said string can supply a current between 2 and 48 ma.

8. The circuit according to claim 1 wherein said first voltage source is between 2.5 and 5 volts.

9. The circuit according to claim 1 wherein said second voltage source is ground.

10. A circuit for protecting integrated semiconductor active devices from damage due to ESD voltages applied to an input or output signal pad said circuit comprising:

at least one switching circuit string composed of a first and second used NMOS device and a used PMOS device wherein the gate of said first used NMOS device is connected to a first voltage source and the drain element of said first used NMOS device is connected to said input/output signal pad and to the drain element of said used PMOS device, and the source of said first used NMOS device is connected to the drain element of said second used NMOS device and the gates of said second used NMOS and said used PMOS are connected to an internal circuit and the source of said used second NMOS is connected to a second voltage source, and the source of said used PMOS is connected to said first voltage source;

a discharging means for discharging positive charges accumulated on said gate of said second used NMOS wherein said discharging means are connected to said internal circuit and said discharging circuit string to prevent said second used NMOS from turning on from said ESD voltage occurrence; and at least one circuit string consisting of a first and second unused dummy NMOS device and an unused dummy PMOS device, wherein the gate of said first unused dummy NMOS device is connected to a first voltage source and the drain element of said first unused dummy NMOS device is connected to said input/output signal pad and to the drain element of said unused dummy PMOS device, and the source of said first unused dummy NMOS device is connected to the drain element of said second unused dummy NMOS device; and the gate and source of said second unused dummy NMOS are connected to said second voltage source and the gate and drain of said unused dummy PMOS are connected to said first voltage source.

11. The circuit according to claim 10 wherein said discharging means comprises a discharging NMOS device, a diode and a resistor.

12. The circuit according to claim 11 wherein the drain of said discharging NMOS device is connected to said internal circuit and to said gate of said second used NMOS, and the source of said discharging NMOS device is connected to said second voltage source and the gate of said discharging NMOS device is connected to said input/output signal pad through said diode and to said second voltage source through said resistor.

13. The circuit according to claim 11 wherein the positive terminal of said diode is connected to said discharging NMOS device gate and to a first side of said resistor and the negative terminal of said diode is connected to said output pad.

14. The circuit according to claim 11 wherein said resistor has a value between 1 and 100 K ohms.

15. The circuit according to claim 10 wherein said switching circuit string provides a driving current to said output pad.

16. The circuit according to claim 15 wherein a value of said driving current is determined by the total number of said switching strings and whereby each said string can supply a current between 2 and 48 ma.

17. The circuit according to claim 10 wherein said first voltage source is between 2.5 and 5 volts.

18. The circuit according to claim 10 wherein said second voltage source is ground.

19. A method of forming a clamped circuit for stacked NMOS ESD protection comprising:

connecting source region of a used PMOS device and source and gate of an unused PMOS device to a first voltage source;

connecting the drains of said used and unused PMOS devices to said stacked NMOS input/output pad;

connecting the drain of said used PMOS device to a drain of a first used NMOS device, and the drain of said unused PMOS device to a drain of a first unused NMOS device;

connecting the gate of said used PMOS device to a logic signal line;

connecting the gates of said first used and said first unused NMOS devices to said first voltage source;

connecting the source of said first used NMOS device to the drain of a second used NMOS device and the source of said first unused NMOS device to the drain of a second unused NMOS device;

connecting the source of said second used NMOS and the source and gate of said second unused NMOS device to a second voltage source; and connecting the gate of said second used NMOS device to said logic signal line and to a discharging means for discharging positive charges accumulated on said gate of said second used NMOS.

20. The method according to claim 19 whereby said discharging means comprises a discharging NMOS device, a diode and a resistor, to prevent said second used NMOS from turning on from said ESD voltage.

21. The method according to claim 20 wherein said discharging means is formed by connecting the drain of said discharging NMOS device to said internal circuit signal line and to said gate of said second used NMOS, and connecting the source of said discharging NMOS to said second voltage source and connecting the gate of said discharging NMOS device to said input/output signal pad through said diode and to said second voltage source through said resistor.

22. The method according to claim 20 wherein said diode is positioned within the discharging means by connecting the positive terminal of said diode to said discharging NMOS device drain and connecting the negative terminal of said diode to said output pad and said resistor.

23. The Method according to claim 20 wherein said resistor is created with a value between 1 and 100 K ohms.

24. The method according to claim 19 whereby said first voltage source is generated to a positive level above ground designated Vcc with a value between 2.5 and 5 volts.

25. The method according to claim 19 whereby said second voltage source connected to a voltage level below Vcc, typically ground.

26. The method according to claim 19 whereby said logic signal line is connected to internal logic devices.

* * * * *